(12) United States Patent
Dilmaghanian et al.

(10) Patent No.: US 10,117,366 B2
(45) Date of Patent: Oct. 30, 2018

(54) SPRING ENERGIZED SEALS AND RELATED METHODS

(71) Applicant: Bal Seal Engineering, Inc., Foothill Ranch, CA (US)

(72) Inventors: Farshid Dilmaghanian, Rancho Santa Margarita, CA (US); Stephen Rust, Lake Forest, CA (US); Jacques Barralon, Laguna Niguel, CA (US); Jin Kim, Los Angeles, CA (US)

(73) Assignee: Bal Seal Engineering, Inc., Foothill Ranch, CA (US)

( * ) Notice: Subject to any disclaimer, the term of this patent is extended or adjusted under 35 U.S.C. 154(b) by 0 days.

(21) Appl. No.: 15/379,290

(22) Filed: Dec. 14, 2016

(65) Prior Publication Data

US 2017/0172018 A1    Jun. 15, 2017

Related U.S. Application Data

(60) Provisional application No. 62/267,076, filed on Dec. 14, 2015.

(51) Int. Cl.
| | |
|---|---|
| *H05K 9/00* | (2006.01) |
| *F16J 15/02* | (2006.01) |
| *F16J 15/3212* | (2016.01) |
| *F16J 15/06* | (2006.01) |
| *F16J 15/3236* | (2016.01) |

(52) U.S. Cl.
CPC .......... *H05K 9/0016* (2013.01); *F16J 15/025* (2013.01); *F16J 15/064* (2013.01); *F16J 15/3212* (2013.01); *F16J 15/3236* (2013.01); *H05K 9/0015* (2013.01)

(58) Field of Classification Search
CPC ..... H05K 9/0016; F16J 15/025; F16J 15/3212
See application file for complete search history.

(56) References Cited

U.S. PATENT DOCUMENTS

| | | | |
|---|---|---|---|
| 4,655,945 A | 4/1987 | Balsells |
| 4,804,290 A | 2/1989 | Balsells |
| 4,805,943 A | 2/1989 | Balsells |
| 5,072,070 A | 12/1991 | Balsells |
| 5,079,388 A | 1/1992 | Balsells |
| 5,091,606 A | 2/1992 | Balsells |
| 5,117,066 A | 5/1992 | Balsells |
| 5,134,244 A | 7/1992 | Balsells |
| 5,161,806 A | 11/1992 | Balsells |
| 5,265,890 A | 11/1993 | Balsells |
| 5,358,224 A | 10/1994 | Balsells |
| 5,474,309 A | 12/1995 | Balsells |

(Continued)

*Primary Examiner* — Hung V Ngo
(74) *Attorney, Agent, or Firm* — Klein, O'Neill & Singh, LLP

(57) ABSTRACT

Seal assemblies with a seal body having an inside flange and an outside flange that are biased outwardly away from one another by a spring energizer, such as a canted coil spring or a V-spring. The seal assemblies further include EMI shielding by incorporating at least one spring energizer that provides at least part of a conductive path between a housing and a pin. The conductive path can alternatively be provided by two different spring energizers and optionally with a conductive strip or trace or via a conductive contact ring element. The present seal assemblies are usable in applications having the needle for both sealing and EMI shielding.

20 Claims, 4 Drawing Sheets

(56) References Cited

U.S. PATENT DOCUMENTS

| | | |
|---|---|---|
| 5,575,487 A | 11/1996 | Balsells |
| 5,599,027 A * | 2/1997 | Balsells ............... H05K 9/0016 |
| | | 174/367 |
| 5,979,904 A | 11/1999 | Balsells |
| 5,984,316 A | 11/1999 | Balsells |
| 5,992,856 A | 11/1999 | Balsells et al. |
| 6,050,572 A | 4/2000 | Balsells et al. |
| 6,161,838 A * | 12/2000 | Balsells ............... F16J 15/3216 |
| | | 277/511 |
| 6,264,205 B1 | 7/2001 | Balsells |
| 6,641,141 B2 | 11/2003 | Schroeder |
| 7,210,398 B2 | 5/2007 | Balsells |
| 7,464,750 B2 | 12/2008 | Schapel et al. |
| 8,096,559 B2 | 1/2012 | Cook |
| 8,328,202 B2 | 12/2012 | Foster et al. |
| 8,544,850 B2 | 10/2013 | Balsells et al. |
| 8,684,362 B2 | 4/2014 | Balsells et al. |
| 9,194,497 B2 | 11/2015 | Rastegar |
| 9,234,591 B2 | 1/2016 | Dilmaghanian et al. |
| 9,285,034 B2 | 3/2016 | Balsells et al. |
| 9,357,684 B2 | 5/2016 | Foster |
| 2006/0066058 A1 * | 3/2006 | Holt ....................... F16J 15/166 |
| | | 277/584 |
| 2007/0108680 A1 * | 5/2007 | Janian ..................... F16F 1/025 |
| | | 267/164 |
| 2009/0146379 A1 * | 6/2009 | Foster ................. F16J 15/3212 |
| | | 277/307 |
| 2010/0052267 A1 * | 3/2010 | Castleman ............. F16J 15/166 |
| | | 277/551 |
| 2010/0237565 A1 | 9/2010 | Foster |
| 2010/0289198 A1 * | 11/2010 | Balsells .................. B21F 35/00 |
| | | 267/151 |
| 2011/0006486 A1 * | 1/2011 | Niknezhad ........... F16J 15/3212 |
| | | 277/562 |
| 2013/0043661 A1 * | 2/2013 | Binder ................... F16J 15/322 |
| | | 277/554 |
| 2014/0265139 A1 * | 9/2014 | Dilmaghanian ..... F16J 15/3208 |
| | | 277/309 |
| 2014/0312570 A1 | 10/2014 | Foster |
| 2015/0083481 A1 * | 3/2015 | Foster .................... F16J 15/061 |
| | | 174/350 |
| 2016/0047473 A1 | 2/2016 | Foster et al. |
| 2016/0223086 A1 | 8/2016 | Balsells et al. |
| 2017/0172018 A1 | 6/2017 | Dilmaghanian et al. |
| 2017/0261108 A1 * | 9/2017 | Soler ................... F16J 15/3452 |
| 2017/0328474 A1 | 11/2017 | Balsells |
| 2018/0112778 A1 | 4/2018 | Dilmaghanian et al. |
| 2018/0119857 A1 | 5/2018 | Balsells |

* cited by examiner

SPRING ENERGIZED SEALS AND RELATED METHODS

FIELD OF ART

The present disclosure is generally related to spring energized seals with specific discussions on spring energized seals with EMI shielding and related methods.

BACKGROUND

Seals for static and dynamic applications eventually wear out. Rotary lip-type seals are generally made from substantially soft materials such as elastomeric materials and certain types of soft plastic materials like polytetrafluoroethylene (PTFE). These materials adjust readily to variations in tolerances and in so doing vary the areas of contact between the seal and the sealing surfaces. In dynamic applications, an increase in the area of contact between the seal and the sealing surface under high sealing stress results in a temperature increase, which causes a decrease in the tensile and shear strength of the softer seal material resulting in a decrease in seal life. The greater the area of contact, the higher the temperature at the sealing area and the faster the seal will likely fail.

Many high temperature seal materials have a higher modulus of elasticity with a higher hardness. The higher hardness reduces flexibility, making it more difficult to affect sealing. These materials thus generally make poor lip-type seals. In order to achieve good sealing, higher modulus materials generally require higher sealing stress than low modulus materials. Furthermore, in order to achieve long seal life, the appropriate sealing stress determined by the viscosity of the media and the dynamic sealing temperature should be known. Since hard plastic materials that can withstand elevated temperatures generally have very low elongation, the range in tolerances of sealing stress under which they can function properly is limited.

SUMMARY

The various embodiments of present spring energized seals have several features, no single one of which is solely responsible for their desirable attributes. Without limiting the scope of the present embodiments as set forth in the claims that follow, their more prominent features now will be discussed briefly.

Aspects of the present disclosure include a seal assembly comprising a seal element having an inside flange and an outside flange defining a first spring groove having a first spring energizer located therein and biasing the inside flange and the outside flange away from one another; a conductive path defined at least in part by a second spring energizer and a third spring energizer in electrical communication with one another for EMI shielding.

The conductive path can include a path through a conductive ring element in contact with the second spring energizer and the third spring energizer.

The conductive path can be defined by a conductive strip connecting the second spring energizer to the third spring energizer.

A conductive ring element can be included with a seal element and latched to the seal element. The conductive ring element can include a latching arm and the seal element can include a latching arm and the two latching arms latch to one another.

The conductive ring element can comprise a second spring groove having the second spring energizer located therein and a third spring groove having the third spring energizer located therein.

The conductive ring element can comprise a channel defined by an inside flange and an outside flange and wherein a latching arm can extend from a center channel section of the seal element and into the channel.

The third spring groove can comprise two sidewalls and a bottom wall located between the two sidewalls.

One of the two sidewalls of the third spring groove can be formed by a surface of the seal element. The surface of the seal element can be on the center channel section of the seal element. The surface of the seal element can be called a seal element sidewall.

The second spring groove can comprise two sidewalls and a bottom wall.

The bottom wall of the second spring groove can be tapered relative to at least one of the two sidewalls.

A further aspect of the present disclosure can include a seal assembly comprising a seal element having an inside flange and an outside flange defining a first spring groove with a latching arm from a conductive ring element, said first spring groove having a first spring energizer located therein and biasing the inside flange away from the outside flange; and a conductive path defined at least in part by a second spring energizer located in a spring groove of the conductive ring element for EMI shielding.

A leaf spring can be incorporated with a conductive ring element for locking the seal assembly to a housing or to a pin.

Another aspect of the present disclosure can include a seal assembly comprising a seal element having an inside flange, an outside flange, and a center channel section defining a first spring groove; the seal assembly further comprising a second spring groove spaced from a third spring groove and spaced from the first spring groove; and wherein a conductive path is defined at least in part by a spring energizer located in the second spring groove and a spring energizer located in the third spring groove being in electrical communication with one another for EMI shielding.

A biasing element can be located in the first spring groove and biasing the inside flange and the outside flange away from one another.

The biasing element in the first spring groove can be a V-spring, a U-shaped spring, a ribbon spring, or a canted coil spring.

A conductive ring element having the second spring groove and the third spring groove can be incorporated with the seal element.

The conductive ring element can be spaced from a surface of the pin if the seal assembly is housing mounted. Alternatively, the conductive ring element can be spaced from a surface of the housing if the seal assembly is pin mounted.

The conductive strip can be in contact with one or two conductive rings.

BRIEF DESCRIPTION OF THE DRAWINGS

These and other features and advantages of the present devices, systems, and methods will become appreciated as the same becomes better understood with reference to the specification, claims and appended drawings wherein:

DETAILED DESCRIPTION

The detailed description set forth below in connection with the appended drawings is intended as a description of the presently preferred embodiments of spring energized seals provided in accordance with aspects of the present devices, systems, and methods and is not intended to represent the only forms in which the present devices, systems, and methods may be constructed or utilized. The description sets forth the features and the steps for constructing and using the embodiments of the present devices, systems, and methods in connection with the illustrated embodiments. It is to be understood, however, that the same or equivalent functions and structures may be accomplished by different embodiments that are also intended to be encompassed within the spirit and scope of the present disclosure. As denoted elsewhere herein, like element numbers are intended to indicate like or similar elements or features.

Figure 1:
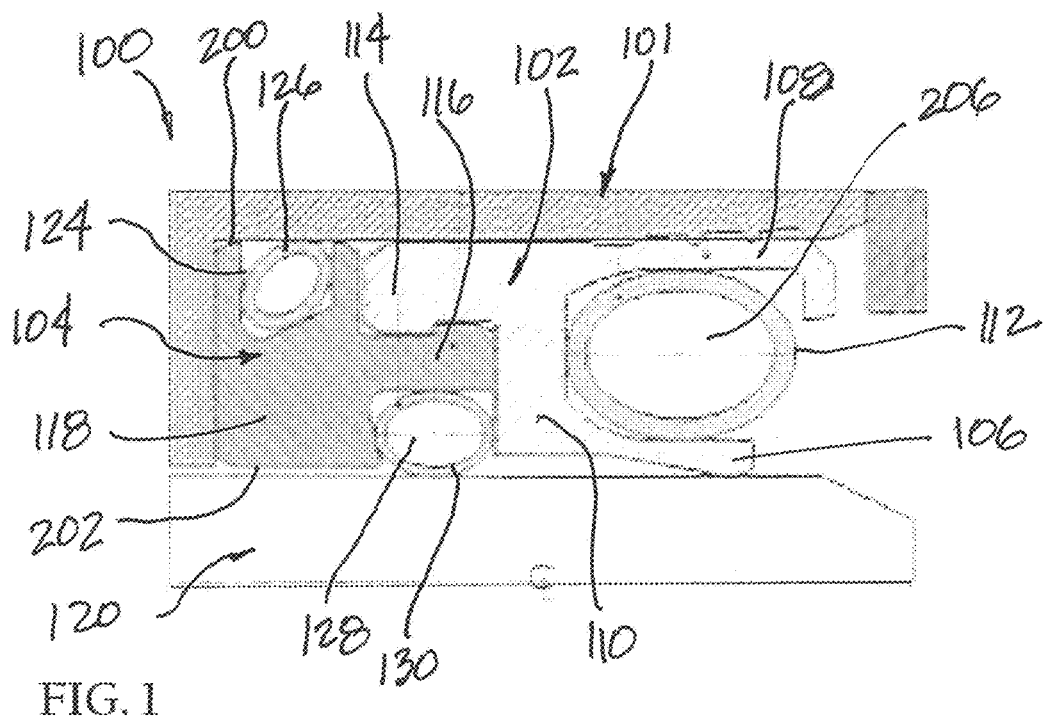
FIG. 1 is a schematic side view of a seal assembly with EMI shielding provided in accordance with aspects of the present disclosure.

FIG. 1 shows a spring energized seal assembly 100 comprising a seal member or seal element 102 and a conductive ring element 104 having an outside diameter 200 and an inside diameter 202 defining a bore for receiving a pin 120 having a tapered insertion end. The seal member 102 has an inside flange 106, an outside flange 108, and a center channel section 110 defining a spring cavity 206 having a biasing element 112 located therein in contact with and biasing the inside and outside flanges away from one another. The biasing element 112 can be a radial canted coil spring comprising a plurality of interconnected canted coils made from a metal material. The coils can each have an elliptical shape but optionally can include different shaped coils, such as square, oval, round, rectangular, etc. As further discussed below, the spring cavity 206 can remain empty by omitting the biasing member or element 112. The sealing element 102 can be made from an elastomeric material or a plastic material, such as PTFE A latching arm 114 extends from the center channel section 110 of the seal member 102 having a free end that extends opposite the free end of the outside flange 108. The latching arm 114 can have a lip and latches to a latching arm 116 extending from a body section 118 of the conductive ring element 104. The latching arm 116 of the conductive ring element 104 therefore has a free end that extends in the direction opposite the free end of the latching arm 114 of the seal element. The latching arm 116 of the conductive ring element 104 can have a lip at the free end and wherein the lips of the two latching arms inter-engage. The free end of the latching arm 116 of the conductive ring element 104 extends in the same direction as the free end of the outside flange 108 and the free end of the inside flange 106. The seal assembly 100 can be mounted to or mounted with a housing 101, which can be a gland of any number of equipment or devices having a shaft or pin 120 passing therethrough that requires sealing. In other examples, the seal assembly can be mounted to a shaft and then inserted into a housing. As the name implied, the conductive ring element 104 is made from an electrically conductive material, such as steel, brass, copper, or alloys thereof. The conductive ring element 104 may optionally have a base conductive material and metal cladding or plating on an exterior thereof. Thus, the latching arm 116 of the conductive ring element 104 may include a base metal having a metal cladding or plating outer layer.

The body section 118 of the conductive ring element 104 can have an outside spring groove 124 having a spring energizer 126 located therein and an inside spring groove 128 having a spring energizer 130 located therein. The outside spring groove 124 can have two sidewalls and a bottom wall located between the two sidewalls. The bottom wall can be flat, such as being parallel to the lengthwise axis of the seal assembly, or can be tapered as shown, tapered to at least one of the two sidewalls. The spring energizer 126 located in the outside spring groove 124 can be a radial canted coil spring or an axial canted coil spring. The coils of the spring energizer 126 can each have a major axis and a minor axis and made from a conductive metal material. The major axis can be wider than the width of the outside spring groove 124, measured between the two sidewalls, so that the coils are rotated or turned when positioned inside the outside spring groove, as shown. In other examples, the major axis of the coils can be equal to or smaller than the width of the outside spring groove 124 so that the coils are not turned when located in the outside spring groove. The bottom wall of the outside spring groove 124 can alternatively be generally flat, such as having a surface that is general parallel to the lengthwise axis of the seal assembly.

The spring cavity defined by the seal element 102 may be referred to as a first spring groove. The outer or outside spring groove 124 may be referred to as a second spring groove. The inner or inside spring groove 128 may be referred to as a third spring groove.

The inside spring groove 128 can have two sidewalls and a bottom wall located between the two sidewalls. One of the sidewalls can be provided by the seal element 102. Said differently, a surface of the seal element can form one of the sidewalls of the inside spring groove 128, called the seal element sidewall, which is understood to form at least part of the seal element. The seal element sidewall can be provided by a side of the body section 118 spaced from the free ends of the inside and outside flanges 106, 108. In other examples, the inside spring groove is formed entirely from the conductive ring element 104 without any of the sidewalls formed by the seal element, similar to the outside spring groove. The bottom wall of the inside spring groove 128 can be tapered relative to one of the sidewalls or flat with a surface that is generally parallel to the lengthwise axis of the seal assembly 100, as shown.

The spring energizer 130 located in the inside spring groove 106 can be a canted coil spring, such as a radial canted coil spring and made from a conductive metal material. In an example, the major axis of the coils of the spring energizer 130 is equal to or smaller than the width of the inside spring groove 106 so that the coils are not rotated when positioned in the inside spring groove 128, as shown. In other examples, the major axis of the coils of the spring energizer 130 is larger than the width of the inside spring groove so that the coils are rotated when positioned in the inside spring groove.

As shown in FIG. 1, the sidewall opposite the seal element sidewall is tapered relative to the seal element sidewall so that the width at the opening of the inside spring groove 128 is smaller than the width at the bottom wall of the inside spring groove 128. This tapered configuration forms a retention groove that can capture the coils therein so that the spring energizer 130 is less prone to slipping out or popping out of the inside spring groove during installation of the seal assembly 100.

In an example, the spring energizer 126 located in the outside spring groove 124 and the spring energizer 130 located in the inside spring groove 128 can have the same spring characteristics, such as same coil shapes, same wire diameter, same front angle, same back angle, same spacing, same coil size, etc. In other examples, the two spring energizers 126, 130 can have different spring characteristics. The biasing element 112 located in the seal spring cavity 206 can have a larger coil dimension than the two spring energizers located in the outer and inner spring grooves 124, 128. In some examples, the biasing element 112 for the first spring cavity 206 can be an elastomeric biasing member, similar to an O-ring. The elastomeric biasing member can have a coil spring embedded inside the ring.

A conductive path is provided between the housing 101 and the pin 120 via the inside spring energizer 130 in contact with the pin, the conductive ring element 104, and the outside spring energizer 126 in contact with the housing. As shown, the conductive ring element 104 is spaced from the pin 120 by a gap while the inside spring energizer 130 is in contact with the pin. The conductive path provides electromagnetic interference (EMI) shielding, which may also be referred to or alternatively be used as radio-frequency interference (RFI) shielding. By providing a conductive layer in the form of the noted conductive path for the seal member 102, incoming or outgoing emissions of electromagnetic frequencies are limited, guarded, or restricted by the conductive path. Said differently, electromagnetic frequencies are blocked by the barriers defined by the combination of the inside spring energizer 130, the conductive ring element 104, and the outside spring energizer 126.

Figure 2:
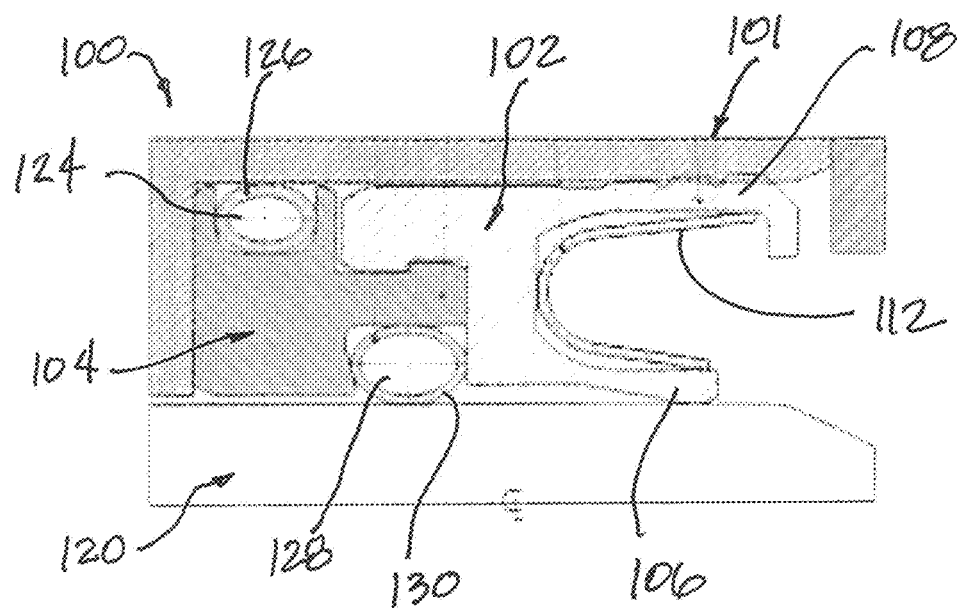
FIG. 2 is a schematic side view of an alternative seal assembly with EMI shielding provided in accordance with aspects of the present disclosure.

FIG. 2 shows an alternative seal assembly 100. The present seal assembly 100 can be similar to the seal assembly of FIG. 1 except for the biasing element 112, which can be a cantilever spring, V-type spring energizer, a U-shaped spring, etc. The biasing element 112 of the present embodiment contacts and biases both the inside flange 106 and the outside flange 108 away from one another. In other examples, the biasing element 112 can be different, such as being a ribbon spring or a helical spring.

In some examples, the various spring energizers and biasing elements can be coated with a wear resistant conductive coating.

The outside spring groove 124 of the present embodiment having the spring energizer 126 located therein can also differ from the outside spring groove 124 of FIG. 1. In the present embodiment, the two sidewalls of the outside spring are generally parallel to one another and the bottom wall is generally flat, having a surface that is generally parallel to the lengthwise axis of the seal assembly 100. The major axis of the spring energizer 126 is approximately equal to or less than the width of the outside spring groove 124 so that the coils of the spring energizer are not turned or rotated when positioned in the spring groove 124. In some examples, the major axis of the coils can be larger than the width of the present outside spring groove so that the coils are turned when positioned inside the spring groove 124. In other examples, the outside spring groove 124 of the present embodiment can be similar to the spring groove 124 of FIG. 1. A conductive path is provided via the two springs 126, 130, which contact the pin and the housing, and the conductive ring element 104 for EMI shielding.

Figure 3:
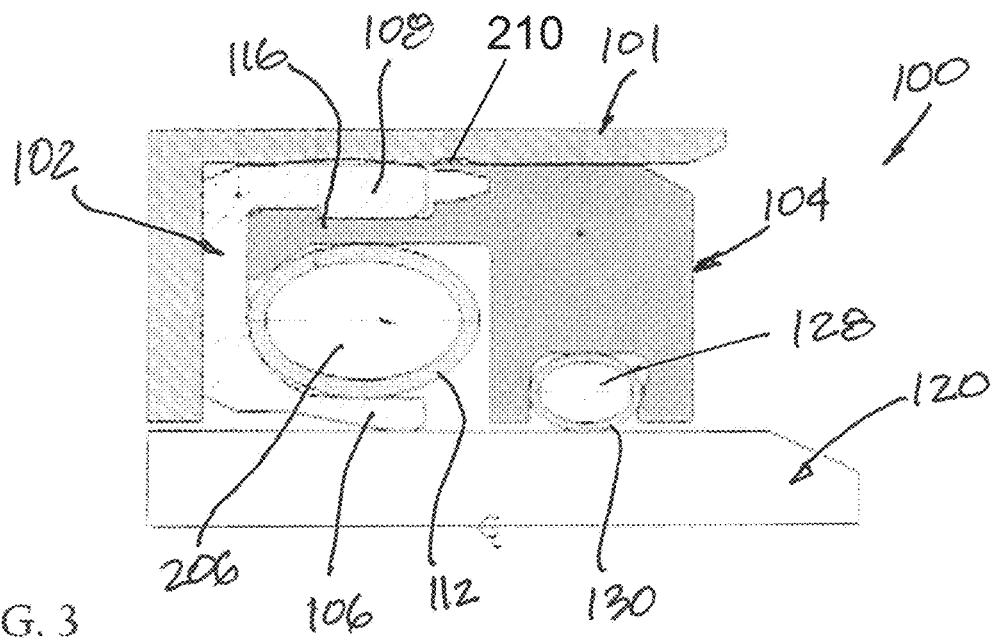
FIG. 3 is a schematic side view of an alternative seal assembly with EMI shielding provided in accordance with aspects of the present disclosure.

FIG. 3 shows a seal assembly 100 comprising a seal element 102 and a conductive ring element 104 mounted to or with a housing 101. In the present embodiment, the conductive ring element 104 not only provides part of a conductive path for EMI shielding, the ring element 104 also functions as a locking ring by incorporating a leaf spring 210 for biasing the ring element 104 against the housing 101. In the present embodiment, the conductive ring element 104 has a latching arm 116 that extends into the seal element, between the inside and outside flanges. The latching arm 116 of the conductive ring element 104 latches with the outside flange 108 of the seal element 102 and forms at least part of the spring groove or spring cavity 206 that receives the spring energizer 112. The spring energizer 112 contacts both the inside and outside flanges 106, 108 and bias the inside flange 106 towards the pin and away from the outside flange 108. The spring energizer 112 also biases against the latching arm 116 of the conductive ring element 104.

Figure 4:
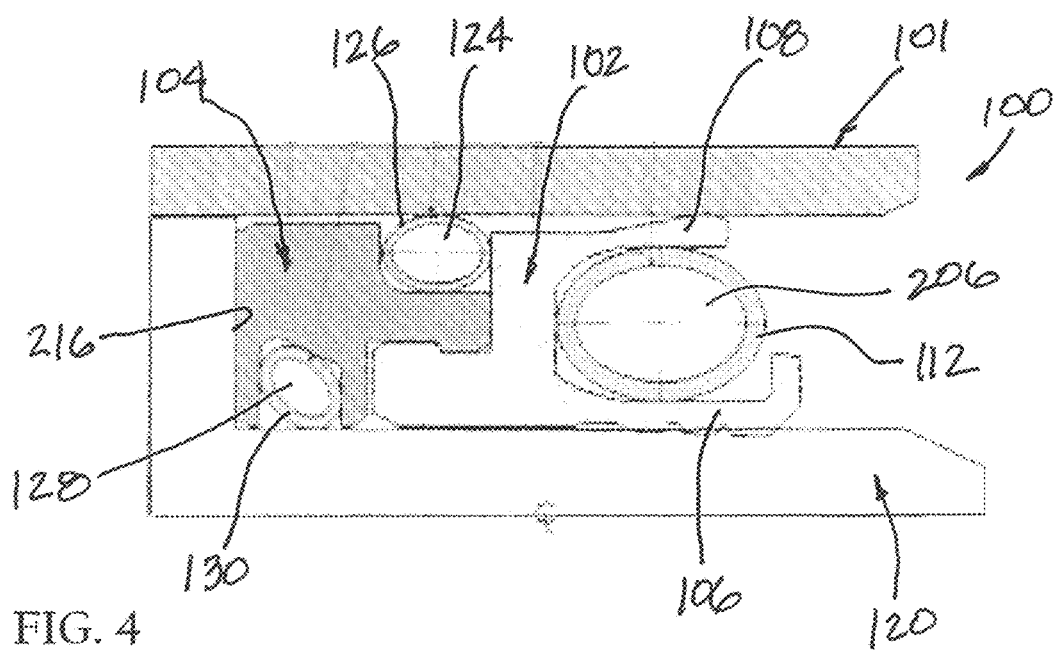
FIG. 4 is a schematic side view of an alternative seal assembly with EMI shielding provided in accordance with aspects of the present disclosure.

In the present embodiment, a single spring groove 128 is provided with the conductive ring element 104 having a spring energizer 130 located therein. The outside diameter or outer perimeter of the conductive ring element 104 contacts the housing 101 and the spring element 130 contacts the pin 120 to provide a conductive path between the housing and the pin for EMI shielding. In another example, the arrangement can be modified to be pin mounted as shown in FIG. 4 instead of housing mounted as shown. A conductive path is provided via the one spring in contact with the pin and mounted in the groove 128 of the conductive contact ring or element 104 and the conductive ring element 104 for EMI shielding.

FIG. 4 shows a seal assembly 100 that is similar to the assembly of FIG. 1 except the seal assembly is piston or pin mounted. That is, the seal assembly 100 can first be mounted onto the pin 120 and then the combination pin and seal assembly installed into the housing 101. For consistency, the inside flange 106 is still identified as such and is the flange that is closest to the pin 120 while the outside flange 108 is located further away from the pin than the inside flange is to the pin. As shown, the pin 120 has an enlarged abutting surface 216. The abutting surface 216 can be singularly formed with the pin, such as machined with the pin, or installed onto the pin and secured thereto using mechanical means, such as with a key and groove combination. The conductive ring element 104 is in contact with the abutting surface 216 but spaced from the housing 101. The perimeter of inside groove 130 can contact the surface of the pin 120 or be spaced from the surface of the pin with only the inner spring element 128 in contact with the surface of the pin. A conductive path is provided via the two springs 126, 130, which contact the pin and the housing, and the conductive ring element 104 for EMI shielding.

Figure 5:
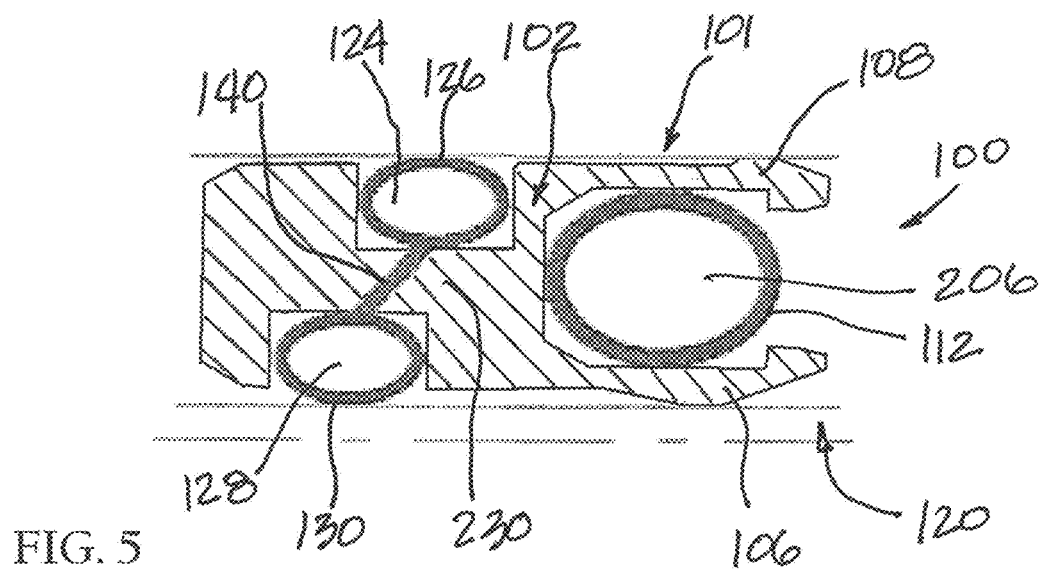
FIG. 5 is a schematic side view of an alternative seal assembly with EMI shielding provided in accordance with aspects of the present disclosure.

FIG. 5 is an alternative seal assembly 100 provided in accordance with aspects of the present disclosure. The seal assembly 100 of FIG. 5 is somewhat similar to the seal assembly of FIG. 1. However, rather than a separate conductive ring element 104, the seal assembly 100 of FIG. 5 can be made from a one-piece seal element 102 with an integrated body extension 230 having one or more EMI shielding spring grooves 124, 128, in addition to the spring groove or spring cavity 206 for use with a biasing member to bias the inside and outside flanges 106, 108 of the seal element away from one another. The one piece seal element can be made from a plastic, an elastomeric, or a thermoplastic elastomer material. To provide a conductive path between the inner spring energizer 130 and the outer spring energizer 126 of the two EMI shielding spring grooves 124, 128, a conductive strip 140 can be provided through the body extension 230 to enable electrical communication between the inner and outer spring energizers 126, 130. In other words the two spring energizers 126, 130 can be in electrical communication with one another via the conductive strip 140. In an example, the conductive strip 140 has two ends that terminate at the bottom wall of the outer spring groove 124 and the bottom wall of the inner spring groove 128.

A conductive path is provided between the housing 101 and the pin 120 via the inside spring energizer 130 in contact with the pin, the outside spring energizer 126 in contact with the housing, and the conductive strip 140. The conductive path provides EMI shielding. In some examples, the bottom wall of the outside spring groove 124 and the bottom wall of the inside spring groove 128 can both be fitted with a conductive ring and the conductive strip 140 electrically connected to both rings.

Figure 6:
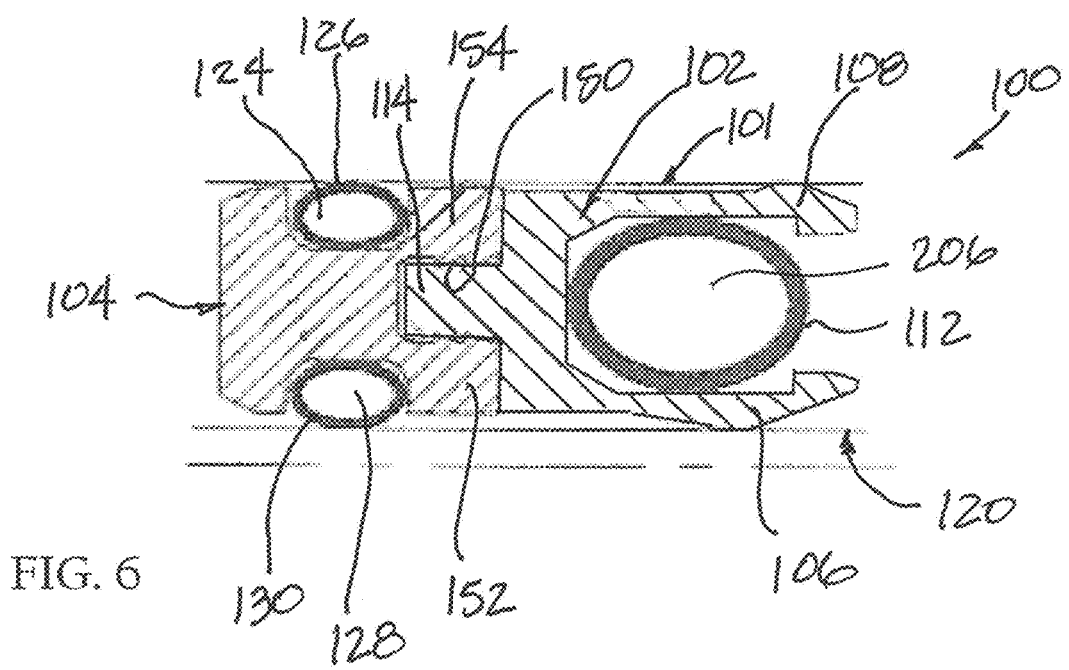
FIG. 6 is a schematic side view of an alternative seal assembly with EMI shielding provided in accordance with aspects of the present disclosure.

FIG. 6 is an alternative seal assembly 100 provided in accordance with yet further aspects of the present disclosure. The seal assembly 100 of the present embodiment comprises a seal element 102 and a conductive ring element 104. The seal element 102 has an inside flange 106 and an outside flange 108 that are biased away from one another by a spring energizer 112, which can be a canted coil spring. In the present embodiment, the conductive ring element 104 has an inside spring groove 124 and an outside spring groove 128 having spring energizers 126, 130 located therein. A conductive path can be provided between a pin 120 and a housing 101 via the two spring energizers 126, 130 and the conductive ring element 104. In the present embodiment, a channel 150 is provided with the conductive ring element 104. The channel 150 is formed between an inside flange 152 and an outside flange 154 of the conductive ring element 104. Said differently, the conductive ring element has an inside flange 152 and an outside flange 154 defining a channel 150 therebetween. The seal element 102 has a latching arm 114 having a free end that extends in the direction opposite the free ends of the inside and outside flanges 106, 108. In an example, the latching arm 114 of the seal element 102 extends from the center channel section of the seal element and into the channel 150 of the conductive ring element 104.

In an example, the latching arm 114 of the seal element 102 is pressed fit in the channel 150 of the conductive ring element. For example, the surfaces of the latching arm 114 can be squeezed by the inside and outside flanges 152, 154 of the conductive ring element 104. A conductive path is provided via the two springs 126, 130, which contact the pin and the housing, and the conductive ring element 104 for EMI shielding.

Figure 7:
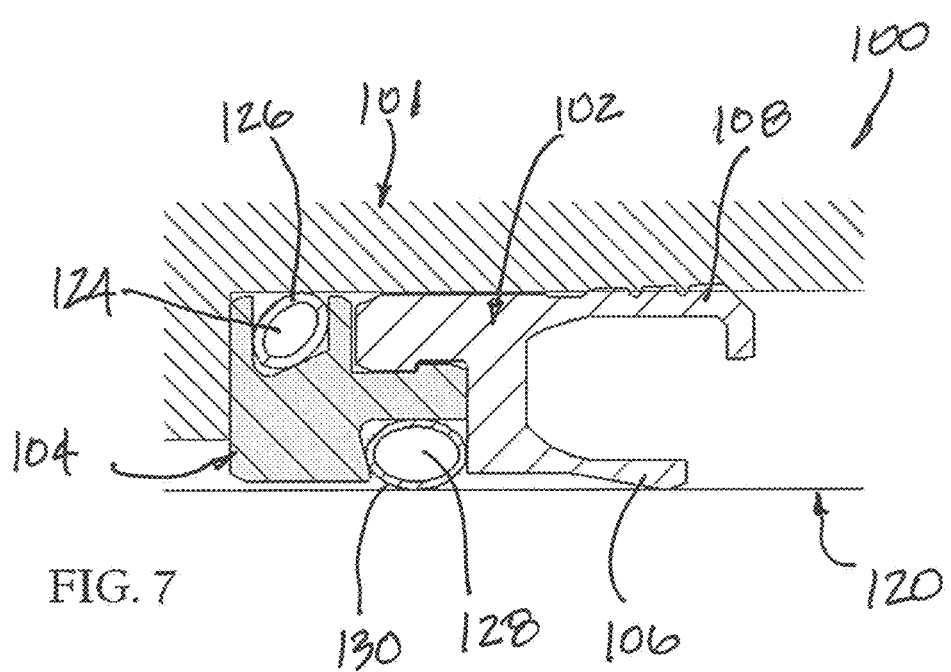
FIG. 7 is a schematic side view of an alternative seal assembly with EMI shielding provided in accordance with aspects of the present disclosure.

FIG. 7 depicts a seal assembly 100 that is similar to the seal assembly 100 of FIG. 1. However, in the present embodiment, the spring cavity 206 of the seal element 102 does not incorporate any biasing element. That is, the present seal assembly 100 uses the natural outwardly biasing characteristics of the inside and outside flanges to seal against the pin and the housing, respectively, without a biasing element in the spring cavity defined by the inside and outside flanges and the center channel section of the seal element. A conductive path is provided via the two springs 126, 130, which contact the pin and the housing, and the conductive contact ring 104 for EMI shielding.

The various seal assemblies described herein are useable in applications that have the need for sealing and EMI shielding. A specific application for the seal assemblies of the present disclosure can be for a gimbal seal. In exemplary embodiments disclosed herein, EMI shielding can be provided by forming a conductive path between the housing and the pin. The conductive path can include two conductive spring contact elements. That is, the conductive path can be defined at least in part by two conduct spring energizers and usable for EMI shielding. The spring contact elements can be canted coil springs. The conductive path can further include a conductive ring element having two grooves. One of the two grooves can have a sidewall formed by an adjacent seal element. In some examples, the conductive path can include a conductive strip in contact with the two conductive spring contact elements. The conductive strip can pass through a non-conducting body. When a conductive contact ring element is used with a seal element, the two components can latch to one another, each with a latching arm.

In some examples, a locking ring having a cantilever spring may be used to secure the seal element to the housing or to the pin, similar to the integrated cantilever spring of FIG. 3 but formed from a ring that is separate from a conductive ring element.

Methods of making and of using the seal assemblies and their components as described herein are understood to be within the scope of the present disclosure.

Although limited embodiments of seal assemblies and their components have been specifically described and illustrated herein, many modifications and variations will be apparent to those skilled in the art. Accordingly, it is to be understood that the seal assemblies and their components constructed according to principles of the disclosed devices, systems, and methods may be embodied other than as specifically described herein. The disclosure is also defined in the following claims.

What is claimed is:

1. A seal assembly comprising a seal element having an inside flange and an outside flange defining a first spring groove having a first spring energizer located therein and biasing the inside flange and the outside flange away from one another;
   a conductive path defined at least in part by a second spring energizer located in a second spring groove and a third spring energizer located in a third spring groove in electrical communication with one another for EMI shielding.

2. The seal assembly of claim 1, wherein the conductive path is further defined by a conductive ring element in contact with the second spring energizer and the third spring energizer.

3. The seal assembly of claim 1, wherein the conductive path is further defined by a conductive strip connecting the second spring energizer to the third spring energizer.

4. The seal assembly of claim 1, further comprising a conductive ring element latched to the seal element.

5. The seal assembly of claim 4, wherein an electrical path is provided between the second spring energizer and the third spring energizer through a body section of the conductive ring element.

6. The seal assembly of claim 5, wherein the third spring groove comprises two sidewalls and a bottom wall located between the two sidewalls.

7. The seal assembly of claim 6, wherein one of the two sidewalls is formed by a surface of the seal element.

8. The seal assembly of claim 7, wherein the second spring groove comprises two sidewalls and a bottom wall.

9. The seal assembly of claim 8, wherein the bottom wall of the second spring groove is tapered relative to at least one of the two sidewalls.

10. The seal assembly of claim 4, wherein the conductive ring element comprises a channel defined by an inside flange and an outside flange and wherein a latching arm extends from a center channel section of the seal element and into the channel.

11. A seal assembly comprising a seal element having an inside flange and an outside flange defining a first spring groove, said first spring groove having a first spring energizer located therein and biasing the inside flange away from the outside flange;
 a conductive ring element in mechanical engagement with the seal element, said conductive ring element having a body with an outside diameter, an inside diameter, and a spring groove along the inside diameter; and
 a conductive path defined at least in part by a second spring energizer located in the spring groove along the inside diameter of the conductive ring element for EMI shielding.

12. The seal assembly of claim 11, wherein a leaf spring is formed with the conductive ring element for locking the seal assembly to a housing or a pin.

13. The seal assembly of claim 11, wherein the spring groove of the body of the conductive ring element is a second spring groove, and further comprising a third spring energizer located in a third spring groove of the conductive ring element for EMI shielding.

14. The seal assembly of claim 13, wherein the second spring energizer and the third spring energizer are in electrical communication with one another through the body of the conductive ring element.

15. A seal assembly comprising a seal element having an inside flange, an outside flange, and a center channel section defining a first spring groove;
 the seal assembly further comprising a second spring groove spaced from a third spring groove and spaced from the first spring groove; and
 wherein a conductive path is defined at least in part by a spring energizer located in the second spring groove and a spring energizer located in the third spring groove being in electrical communication with one another for EMI shielding.

16. The seal assembly of claim 15, further comprising a biasing element located in the first spring groove biasing the inside flange and the outside flange away from one another.

17. The seal assembly of claim 16, wherein the biasing element is a V-spring.

18. The seal assembly of claim 15, further comprising a conductive ring element having the second spring groove and the third spring groove.

19. The seal assembly of claim 18, wherein the third spring groove comprises two sidewalls and a bottom wall located between the two sidewalls.

20. The seal assembly of claim 18, wherein one of the two sidewalls is formed by a surface of the seal element.

\* \* \* \* \*